US010615167B2

(12) United States Patent
Lee

(10) Patent No.: US 10,615,167 B2
(45) Date of Patent: Apr. 7, 2020

(54) MEMORY DEVICE INCLUDING OTP MEMORY CELL AND PROGRAM METHOD THEREOF

(71) Applicant: SAMSUNG ELECTRONICS CO., LTD., Suwon-si (KR)

(72) Inventor: Sang-Seok Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 16 days.

(21) Appl. No.: 15/848,988

(22) Filed: Dec. 20, 2017

(65) Prior Publication Data

US 2018/0358369 A1 Dec. 13, 2018

(30) Foreign Application Priority Data

Jun. 12, 2017 (KR) ........................ 10-2017-0073387

(51) Int. Cl.
*G11C 17/00* (2006.01)
*H01L 27/112* (2006.01)
*G11C 17/16* (2006.01)
*G11C 11/00* (2006.01)
*G11C 17/18* (2006.01)
*G11C 29/00* (2006.01)

(52) U.S. Cl.
CPC ...... *H01L 27/11206* (2013.01); *G11C 11/005* (2013.01); *G11C 17/16* (2013.01); *G11C 17/165* (2013.01); *G11C 17/18* (2013.01); *G11C 29/74* (2013.01); *G11C 29/781* (2013.01); *G11C 29/785* (2013.01); *G11C 29/846* (2013.01); *H01L 27/11286* (2013.01)

(58) Field of Classification Search
CPC ............. G11C 17/16; G11C 2229/763; G11C 11/4096
USPC .......................................................... 365/96
See application file for complete search history.

(56) References Cited

U.S. PATENT DOCUMENTS

| | | |
|---|---|---|
| 6,671,040 B2 | 12/2003 | Fong et al. |
| 7,633,829 B2 | 12/2009 | Fasoli et al. |
| 8,913,449 B2 | 12/2014 | Chung |
| 9,263,150 B2 | 2/2016 | Yoon |
| 9,293,218 B2 | 3/2016 | Yu et al. |
| 9,524,795 B2 | 12/2016 | Lee et al. |
| 2002/0031017 A1* | 3/2002 | Yumoto ................. G11C 29/24 365/200 |
| 2003/0063518 A1 | 4/2003 | Fong et al. |
| 2008/0101149 A1 | 5/2008 | Fasoli et al. |
| 2012/0120707 A1* | 5/2012 | Kim ........................ G11C 17/12 365/104 |

(Continued)

*Primary Examiner* — Hoai V Ho
(74) *Attorney, Agent, or Firm* — Sughrue Mion, PLLC

(57) ABSTRACT

A memory device includes a main one-time programmable (OTP) memory cell connected to a main word line and a main bit line; a redundant OTP memory cell connected to a redundant word line and a redundant bit line; and an input/output circuit configured to, during a program operation to program the main OTP memory cell and the redundant OTP memory cell, electrically separate the main bit line and the redundant bit line and form a first program current path to the main bit line and a second program current path to redundant bit line, wherein the first program current path and the second program current path are independent from each other.

16 Claims, 10 Drawing Sheets

(56) References Cited

U.S. PATENT DOCUMENTS

| | | | |
|---|---|---|---|
| 2013/0182518 A1* | 7/2013 | Kim | G11C 17/16 365/201 |
| 2013/0235644 A1 | 9/2013 | Chung | |
| 2013/0294141 A1 | 11/2013 | Oh et al. | |
| 2014/0104921 A1 | 4/2014 | Yu et al. | |
| 2015/0078059 A1* | 3/2015 | Knoedgen | G11C 17/16 365/94 |
| 2015/0287474 A1 | 10/2015 | Yoon | |
| 2016/0012908 A1 | 1/2016 | Kang | |
| 2016/0148705 A1 | 5/2016 | Lee et al. | |
| 2016/0172053 A1 | 6/2016 | Ha | |
| 2017/0040067 A1* | 2/2017 | Byun | G11C 17/18 |

\* cited by examiner

MEMORY DEVICE INCLUDING OTP MEMORY CELL AND PROGRAM METHOD THEREOF

CROSS-REFERENCE TO RELATED APPLICATIONS

This application claims priority from Korean Patent Application No. 10-2017-0073387 filed on Jun. 12, 2017, in the Korean Intellectual Property Office, the entire contents of which are hereby incorporated by reference.

BACKGROUND

Example embodiments of the present disclosure relate to a semiconductor memory device, and more particularly, to a memory device including one-time programmable (OTP) memory cells and a program method thereof.

A device, which retains data stored therein even at power supply is interrupted, is referred to as a nonvolatile memory. For example, the nonvolatile memory includes a read only memory (ROM), a magnetic disk, an optical disk, a flash memory, etc. In particular, a nonvolatile memory, in which data written once therein are not changeable, is referred to as a one-time programmable (OTP) memory. Once data is programmed in the OTP memory, a characteristic of a memory cell being a storage unit of data may be irreversibly changed, and "0" or "1" may be stored by using the irreversible characteristic. An OTP memory device may be variously used as a built-in nonvolatile memory device for purposes such as repairing of another memory device, analog trimming, and storage of security code.

There is a need for a high voltage, a program current, and a relatively long program time to program the OTP memory device. Accordingly, there is a need to shorten a program time of the OTP memory to reduce manufacturing costs of a semiconductor device including the OTP memory.

SUMMARY

Example embodiments provide an OTP memory device supporting high-speed and high-reliability programming and a program method thereof.

According to an aspect of an example embodiment, a memory device includes: a main OTP memory cell connected to a main word line and a main bit line, a redundant OTP memory cell connected to a redundant word line and a redundant bit line, and an input/output circuit configured to, during a program operation to program the main OTP memory cell and the redundant OTP memory cell, electrically separate the main bit line and the redundant bit line and form a first program current path to the main bit line and a second program current path to redundant bit line, wherein the first program current path and the second program current path are independent from each other.

According to aspect of another example embodiment, a program method of a memory device which includes a main OTP memory cell and a redundant OTP memory cell, the program method including: receiving an address for selecting the main OTP memory cell and the redundant OTP memory cell together, generating a program voltage to be supplied to a main word line of the main OTP memory cell and a redundant word line of the redundant OTP memory cell, electrically separating a main bit line to which the main OTP memory cell is connected and a redundant bit line to which the redundant OTP memory cell is connected, and supplying the program voltage to the main word line of the main OTP memory cell and the redundant word line of the redundant OTP memory cell and forming a first program current path to the main bit line and a second program current path to the redundant bit line, wherein the first program current path and the second program current path are independent from each other.

According to aspect of another example embodiment, a memory device includes a main cell array comprising a plurality of main OTP memory cells; a redundant cell array comprising a plurality of redundant OTP memory cells; and an input/output circuit comprising a first current source circuit and a second current source circuit, the input/output circuit being configured to electrically connect the first current source circuit to a main OTP memory cell selected from among the plurality of main OTP memory cells and the second current source circuit to a redundant OTP memory cell selected from among the plurality of redundant OTP memory cells, depending on an operation mode.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

The present invention will be described more fully hereinafter with reference to the accompanying drawings, in which example embodiments of the invention are shown.

Figure 1:
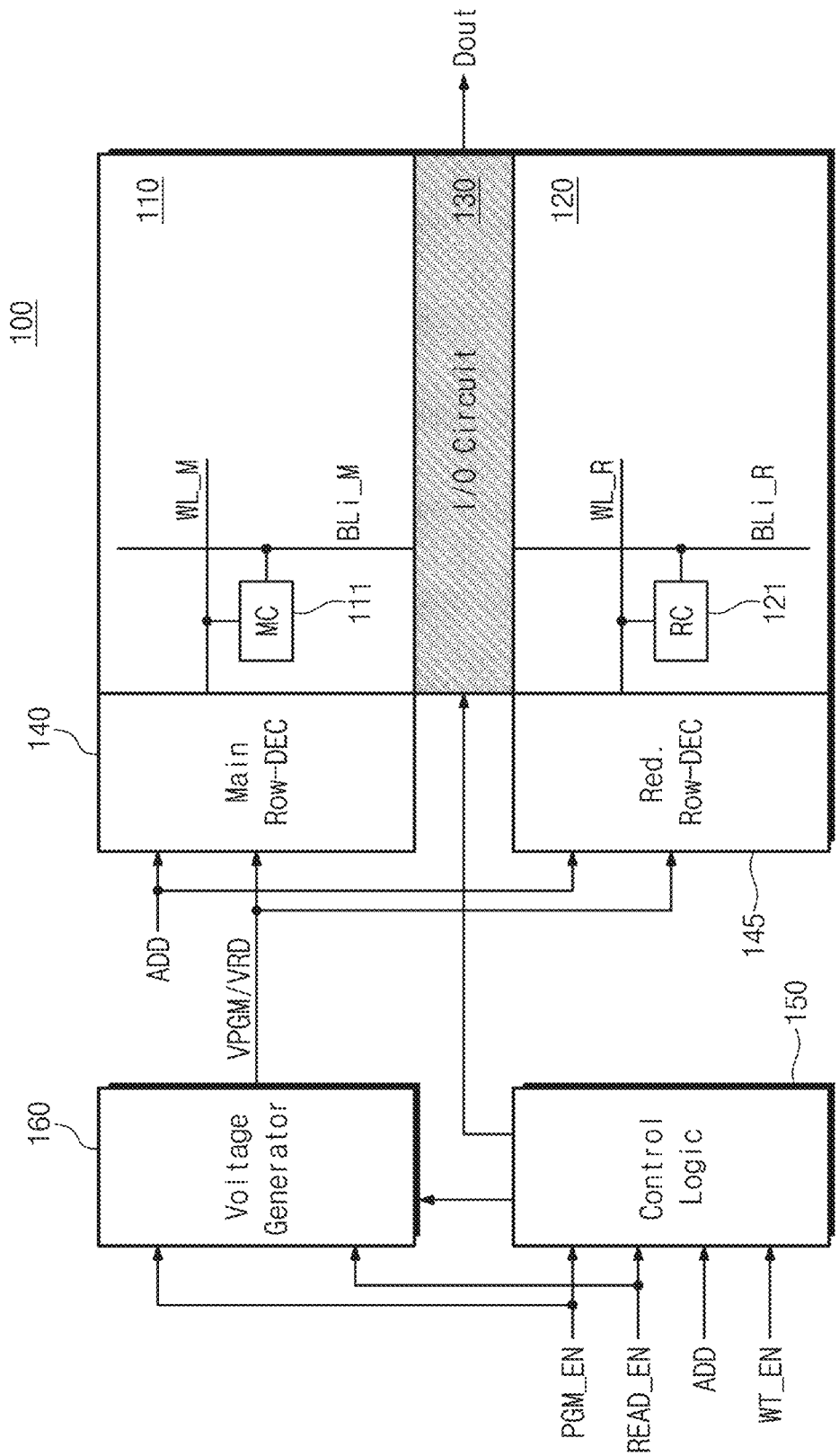
FIG. 1 is a block diagram illustrating a one-time programmable (OTP) memory device according to an example embodiment.

FIG. 1 is a block diagram illustrating an OTP memory device according to an example embodiment. Referring to FIG. 1, an OTP memory device 100 includes cell arrays 110 and 120, an input/output circuit 130, row decoders 140 and 145, control logic 150, and a voltage generator 160.

The cell arrays 110 and 120 may include a plurality of OTP memory cells. The OTP memory cells are programmed through oxide breakdown. The cell arrays 110 and 120 includes a main cell array 110 formed on one side of the input/output circuit 130 and a redundant cell array 120 formed on an opposite side of the input/output circuit 130. Each of the main cell array 110 and the redundant cell array 120 may include a plurality of OTP memory cells. Below, an OTP memory cell included in the main cell array 110 is referred to as a "main cell MC" and an OTP memory cell included in the redundant cell array 120 is referred to as a "redundant cell RC". A main cell (MC) 111 connected to a word line WL_M (also referred to as a "main word line") and a bit line BLi_M (also referred to as a "main bit line") is included in the main cell array 110. A redundant cell (RC) 121 connected to a word line WL_R (herein also referred to as a "redundant word line") and a bit line BLi_R (herein also referred to as a "redundant bit line") is included in the redundant cell array 120.

The main cell 111 and the redundant cell 121 that store the same data are provided with a program voltage VPGM through the word lines WL_M and WL_R during a program operation. The main cell 111 and the redundant cell 121 are supplied with a program current Ip through the bit lines BL_M and BL_R. In particular, the main cell 111 and the redundant cell 121 may be supplied with the program current Ip from a separate current source circuit during the program operation. In the case of sharing one bit line, a program fail may occur due to a difference between a program speed of the main cell 111 and a program speed of the redundant cell 121. However, according to an example embodiment, a program fail may not occur even though the program speeds of the main cell 111 and the redundant cell 121 differ from each other.

The input/output circuit 130 controls bit lines of the main cell 111 and the redundant cell 121 under control of the control logic 150. During the program operation, the input/output circuit 130 separates the bit lines BLi_M and BLi_R of the main cell 111 and the redundant cell 121 storing the same data. The input/output circuit 130 may supply independently generated program currents Ip to each of the separated bit lines BLi_M and BLi_R. During a read operation, the input/output circuit 130 connects the bit lines BLi_M and BLi_R to sense the main cell 111 and the redundant cell 121 at the same time. It will understood that the input/output circuit 130 may sequentially select the main cell 111 and the redundant cell 121 under a specific condition.

The main row decoder 140 and the redundant row decoder 145 may select OTP memory cells of the main cell array 110 and the redundant cell array 120 in response to one row address. For example, a main row decoder 140 and a redundant row decoder 145 may select the main word line WL_M and the redundant word line WL_R, respectively, in response to a row address ADD. Accordingly, during the program operation or the read operation, the main row decoder 140 and the redundant row decoder 145 may simultaneously program or sense the main cell 111 and the redundant cell 121, respectively, in response to one row address at the same time.

The control logic 150 controls the input/output circuit 130 or the voltage generator 160 in response to a command, an address, a control signal, etc. provided from the outside. Here, the control signal includes a program enable signal PGM_EN, a read enable signal READ_EN, and a write enable signal WT_EN. During the program operation (PGM_EN activation), the control logic 150 may control the voltage generator 160 to provide the program voltage VPGM to the word lines WL_M and WL_R of the main cell 111 and the redundant cell 121 that are selected. In contrast, during the read operation (READ_EN activation), the control logic 150 may control the voltage generator 160 to provide a read voltage VRD to the word lines WL_M and WL_R of the main cell 111 and the redundant cell 121 that are selected.

In addition, during the program operation, the control logic 150 may control the input/output circuit 130 in response to the control signal PGM_EN or WT_EN to separate the bit lines BLi_M and BLi_R from each other. The separated bit lines BLi_M and BLi_R are respectively connected to independent current source circuits. During the read operation, the control logic 150 may control the input/output circuit 130 in response to the control signal READ_EN to connect the bit lines BLi_M and BLi_R and to connect the bit lines BLi_M and BLi_R to a sense amplifier. Here, the bit lines BLi_M and BLi_R are a bit line that is specified by the same column address and is placed at the same column. The bit lines BLi_M and BLi_R may be electrically separated from each other such that a program current is stably supplied by the input/output circuit 130 during the program operation.

The voltage generator 160 may generate various driving voltages to be used in the OTP memory device 100 under control of the control logic 150. Oxide breakdown of a transistor is required to program an OTP memory cell. Accordingly, for the oxide breakdown, the voltage generator 160 may generate the program voltage VPGM having a relatively high level. The voltage generator 160 may include a charge pump to generate the program voltage VPGM. The read voltage VRD provided during the read operation may be a relatively low voltage. The voltage generator 160 may include a voltage regulator to generate a low-level voltage such as the read voltage VRD. It will be understood that a way for the voltage generator 160 to generate the program voltage VPGM and/or the read voltage VRD is not limited to the above-described manner and various converter circuits and various level-up/level-down manners may be used.

According to the OTP memory device 100 described above, the bit line BL_M to which the main cell 111 is connected and the bit line BL_R to which the redundant cell 121 is connected are separated from each other during the program operation. Current source circuits that are able to supply program currents independently are connected to the bit lines BL_M and BL_R that are separated. The OTP memory device 100 with the above-described structure may prevent a program fail from occurring due to a difference between points in time when oxides of the main cell 111 and the redundant cell 121 are broken down. As the main cell MC and the redundant cell RC are simultaneously programmed, the OTP memory device 100 may be programmed at high speed, and test time costs may be markedly reduced.

Figure 2A:
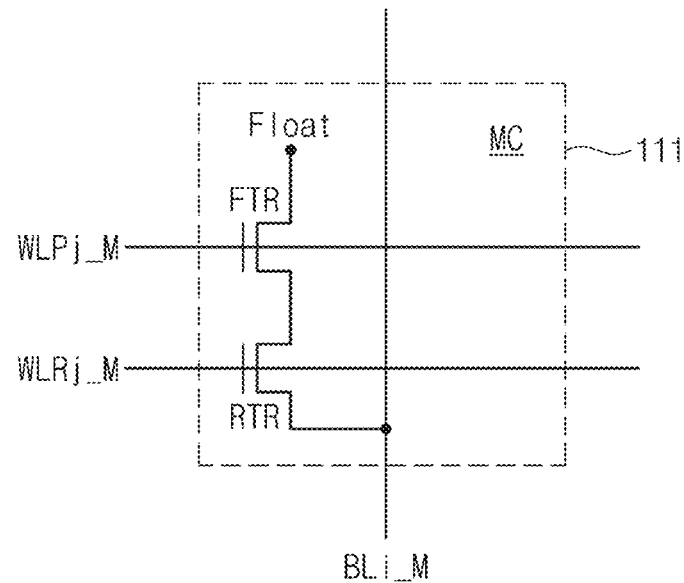
FIGS. 2A and 2B are circuit diagrams illustrating a structure of a memory cell illustrated in FIG. 1.
Figure 2B:
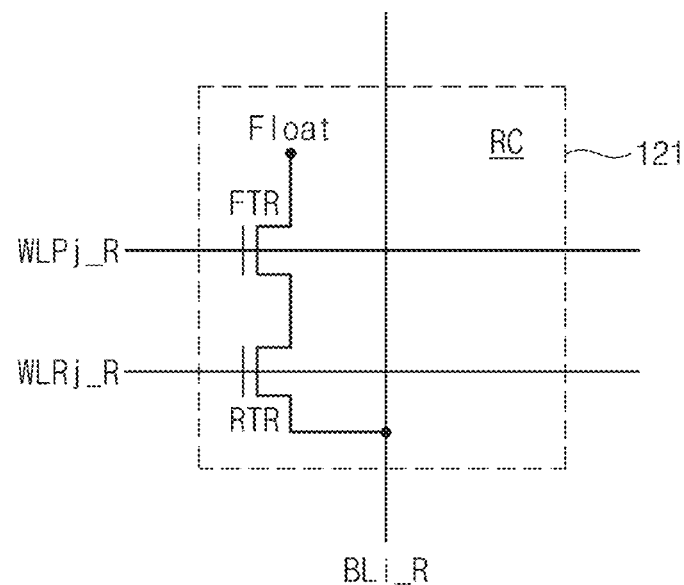

FIGS. 2A and 2B are circuit diagrams illustrating a structure of a memory cell illustrated in FIG. 1. FIG. 2A illustrates a structure of the main cell 111, and FIG. 2B illustrates a structure of the redundant cell 121.

Referring to FIG. 2A, the main cell 111 includes a fuse transistor FTR and a selection transistor RTR. A gate of the fuse transistor FTR is connected to a program word line WLPj_M. One end (or a drain) of the fuse transistor FTR is floated, and an opposite end (or a source) of the fuse transistor FTR is connected to a drain of the selection transistor RTR. The fuse transistor FTR may be implemented with, for example, a metal oxide semiconductor (MOS) transistor. A gate of the selection transistor RTR is connected to a selection word line WLRj_M. A source of the selection transistor RTR is connected to a bit line BLi_M.

During a program operation, a relatively high program voltage VPGM is applied to the program word line WLPj_M of the main cell 111. During the program operation, a selection voltage lower than the program voltage VPGM is applied to the selection word line WLRj_M of the main cell 111. The program current Ip for pull-down is supplied to the bit line BLi_M. According to the above-described bias condition, an oxide layer of the fuse transistor FTR is broken down by a great voltage difference between the gate and a channel of the fuse transistor FTR.

During a read operation, a read voltage VRD lower than the program voltage VPGM is applied to the program word line WLPj_M of the main cell 111. The selection voltage is applied to the selection word line WLRj_M of the main cell 111. Here, the selection voltage is a voltage that is sufficient to turn on the selection transistor RTR. According to the above-described bias condition, a current path is formed between the program word line WLPj_M and the bit line BLi_M depending on whether the fuse transistor FTR is programmed. If the fuse transistor FTR is programmed by the oxide breakdown, a current path may be formed between the program word line WLPj_M and the bit line BLi_M, and thus, a sensing current may be detected by a sense amplifier.

Referring to FIG. 2B, the redundant cell 121 includes a fuse transistor FTR connected to a program word line WLPj_R and a selection transistor RTR connected to a selection word line WLRj_R. The redundant cell 121 is selected by the same row address and column address as the main cell 111. A bias provided upon programming or reading the redundant cell 121 is substantially the same as the main cell 111, and a description thereof will not be repeated here. However, during the program operation, a bit line BLi_R to which the redundant cell 121 is connected and the bit line BLi_M to which the main cell 111 is connected are separated. In addition, the program current Ip may be independently supplied to the separated bit lines BLi_M and BLi_R. However, the bit lines BLi_M and BLi_R are placed at the same column and are selected by the same column address.

Figure 3:
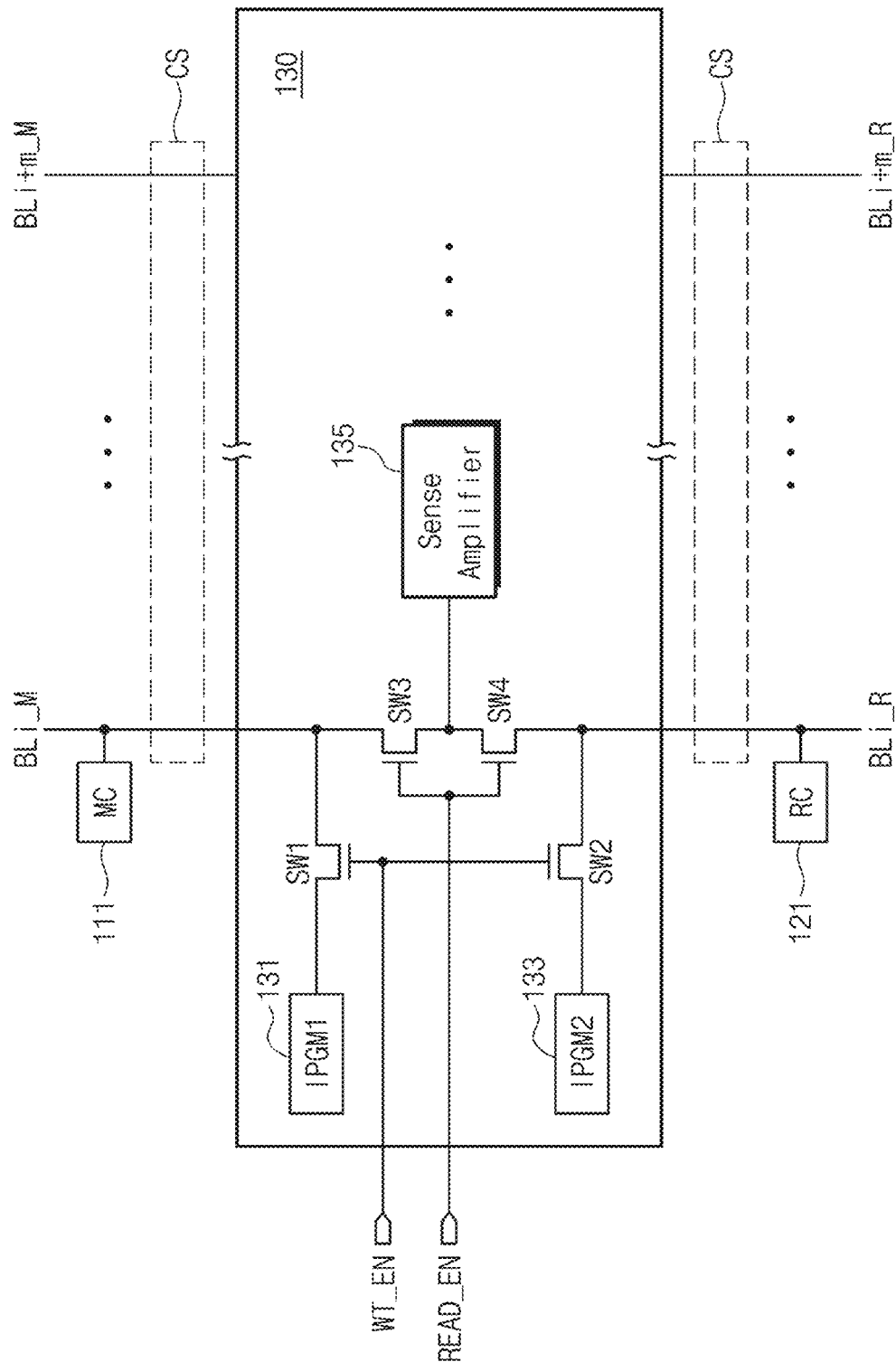
FIG. 3 is a block diagram illustrating an input/output circuit according to an example embodiment.

FIG. 3 is a block diagram illustrating an input/output circuit according to an example embodiment. Referring to FIG. 3, the input/output circuit 130 includes a first current source circuit 131, a second current source circuit 133, a sense amplifier 135, and a plurality of switches, i.e., a first switch SW1, a second switch SW2, a third switch SW3, and a fourth switch SW4.

The input/output circuit 130 connects the bit line BLi_M to which the main cell 111 is connected and the bit line BLi_R to which the redundant cell 121 is connected, depending on an operation mode. In addition, the input/output circuit 130 may connect or disconnect (separate) the bit line BLi_M and the bit line BLi_R to or from the first current source circuit 131 and the second current source circuit 133, depending on an operation mode. Also, the input/output circuit 130 connects the bit line BLi_M and the bit line BLi_R with the sense amplifier 135 according to an operation mode.

During a program operation, the input/output circuit 130 separates the bit line BLi_M and the bit line BLi_R. If the third and fourth switches SW3 and SW4 are turned off by deactivation of the read enable signal READ_EN, the bit line BLi_M and the bit line BLi_R are electrically separated. In addition, if the third and fourth switches SW3 and SW4 are turned off, the bit line BLi_M and the bit line BLi_R are electrically separated from the sense amplifier 135.

During the program operation, the input/output circuit 130 connects the bit line BLi_M and the bit line BLi_R to the first current source circuit 131 and the second current source circuit 133, respectively. The bit line BLi_M and the bit line BLi_R are respectively connected to the first current source circuit 131 and the second current source circuit 133 by the first and second switches SW1 and SW2 that are turned on by activation of the write enable signal WT_EN. Since the bit line BLi_M and the bit line BLi_R are separated during the program operation, the main cell 111 and the redundant cell 121 do not influence each other during performing the program operation.

During a read operation, the write enable signal WT_EN is deactivated, and a read enable signal READ_EN is activated. Since the read enable signal READ_EN is activated, the input/output circuit 130 electrically connects the bit line BLi_M and the bit line BLi_R. If the third and fourth switches SW3 and SW4 are turned on by the activation of the read enable signal READ_EN, the bit line BLi_M and the bit line BLi_R are connected to the sense amplifier 135. In addition, since the third and fourth switches SW3 and SW4 are turned on, the bit line BLi_M and the bit line BLi_R are electrically connected to each other.

During the read operation, the input/output circuit 130 disconnects the bit line BLi_M and the bit line BLi_R from the first current source circuit 131 and the second current source circuit 133, respectively. This may be accomplished by turning off the first and second switches SW1 and SW2 by deactivation of the write enable signal WT_EN.

A column selector circuit CS that selects a bit line in response to a column address may be disposed between the input/output circuit 130 and bit lines BLi_M to BLi+m_M of the main cell array 110. In addition, a column selector circuit CS that selects a bit line in response to a column address may be disposed between the input/output circuit 130 and bit lines BLi_M to BLi+m_M of the redundant cell array 120.

An operation of the input/output circuit 130 for each operation mode is described above with regard to the main cell 111 and the redundant cell 121 corresponding to one column. However, the input/output circuit 130 may perform the above-described switching operation on bit lines corresponding to each address.

Figure 4:
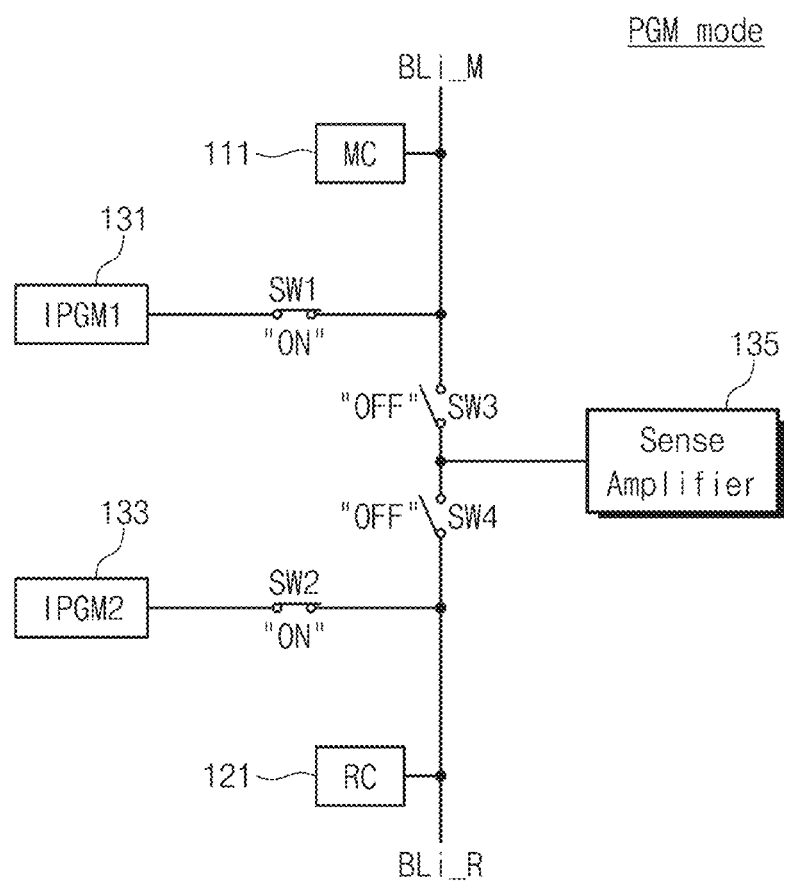
FIG. 4 is a view illustrating a switching state of the input/output circuit according to an example embodiment during a program operation.

FIG. 4 is a view illustrating a switching state of an input/output circuit according to an example embodiment during a program operation. Referring to FIG. 4, during a program operation, the bit line BLi_M of the main cell 111 and the bit line BLi_R of the redundant cell 121 are electrically separated.

During the program operation, the write enable signal WT_EN is activated (or logic "H"), and the read enable signal READ_EN is deactivated (or logic "L"). Accordingly, the first and second switches SW1 and SW2 are turned on, and the third and fourth switches SW3 and SW4 are turned off. Since the first switch SW1 is turned on, the first current source circuit 131 is connected to the main cell 111 through the bit line BLi_M. In this case, a program voltage and a program current are provided to the fuse transistor FTR of the main cell 111, and thus, a program operation is performed by the oxide breakdown. The program operation is identically applied to the redundant cell 121. However, since the third and fourth switches SW3 and SW4 are turned off, the bit line BLi_M and the bit line BLi_R are electrically separated. Accordingly, the main cell 111 and the redundant cell 121 do not influence each other during the program operation.

Figure 5:
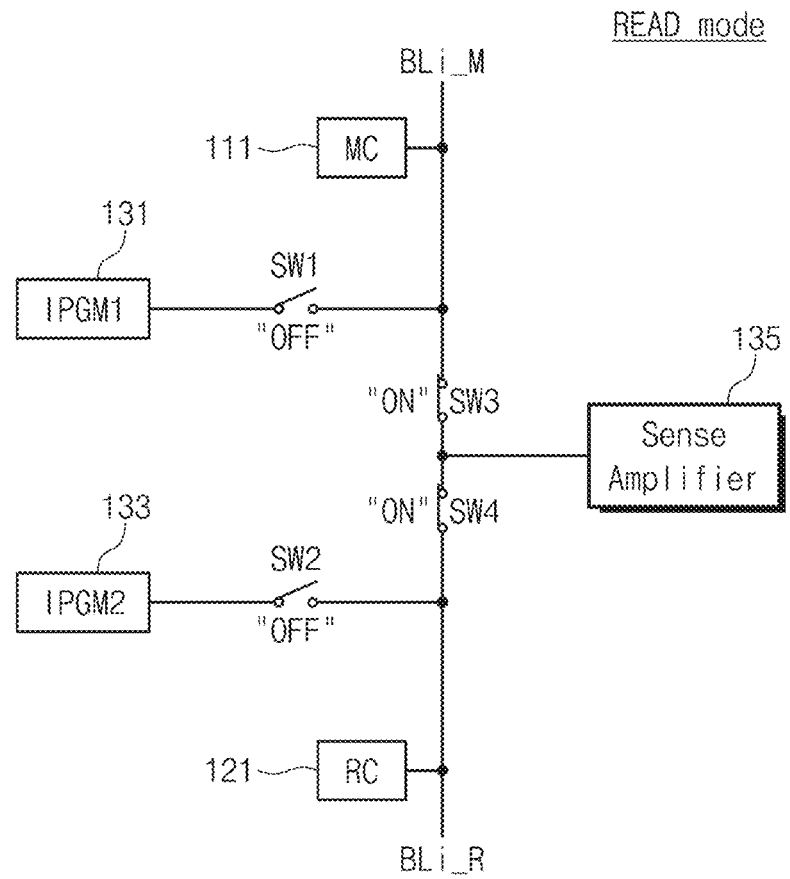
FIG. 5 is a view illustrating a switching state of the input/output circuit according to an example embodiment during a read operation.

FIG. 5 is a view illustrating a switching state of an input/output circuit according to an example embodiment during a read operation. Referring to FIG. 5, during a read operation, the bit line BLi_M of the main cell 111 and the bit line BLi_R of the redundant cell 121 are connected. The first current source circuit 131 and the second current source circuit 133 are respectively separated from the bit line BLi_M and the bit line BLi_R.

During the read operation, the write enable signal WT_EN is deactivated (or logic "L"), and the read enable signal READ_EN is activated (or logic "H"). Accordingly, the third and fourth switches SW3 and SW4 are turned on, and the first and second switches SW1 and SW2 are turned off. Since the first switch SW1 is turned off, the first current source circuit 131 is electrically separated from the bit line BLi_M. Since the second switch SW2 is turned off, the second current source circuit 133 is electrically separated from the bit line BLi_R.

However, since the third and fourth switches SW3 and SW4 are turned on, the bit line BLi_M and the bit line BLi_R are electrically connected to each other. The electrically connected bit lines BLi_M and BLi_R are connected to the sense amplifier 135. Accordingly, it is possible to sense data stored in the respective fuse transistors FTR of the main cell 111 and the redundant cell 121. In the case where an oxide layer of the fuse transistor FTR of each of the main cell 111 and the redundant cell 121 is broken down, a sensing current may be transferred to the sense amplifier 135 from each of the main cell 111 and the redundant cell 121 depending on the read voltage VRD.

Figure 6:
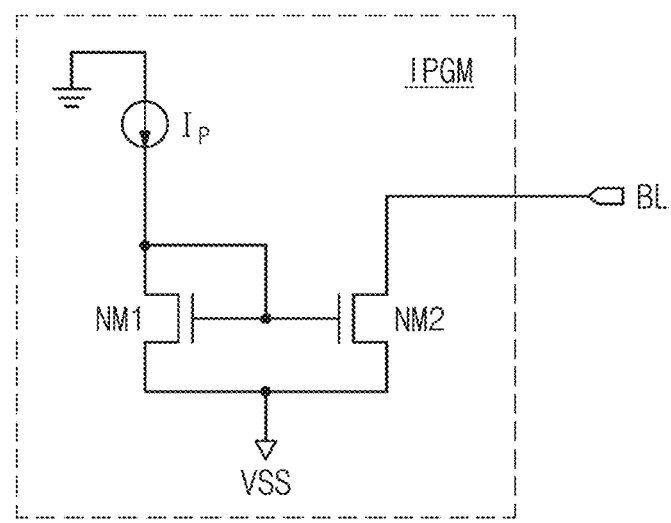
FIG. 6 is a circuit diagram illustrating a current source circuit for providing a program current, according to an example embodiment.

FIG. 6 is a circuit diagram illustrating a current source circuit for providing a program current, according to an example embodiment. Referring to FIG. 6, a current source circuit IPGM is a circuit for defining the magnitude of a current generated upon breaking down an oxide layer of the fuse transistor FTR during a program operation.

The current source circuit IPGM may be implemented in the form of a current mirror in which gates of two transistors NM1 and NM2 are shared. During a program operation, the current source circuit IPGM induces a bit line (BL) current as much as the program current Ip flowing to the transistor NM1. The current source circuit IPGM may allow the program current Ip to flow to a fuse transistor connected to the bit line BL. A current mirror is illustrated as an exemplary form of the current source circuit IPGM. However, it will be understood that the current source circuit IPGM may be implemented with various forms of other circuits.

Figure 7:
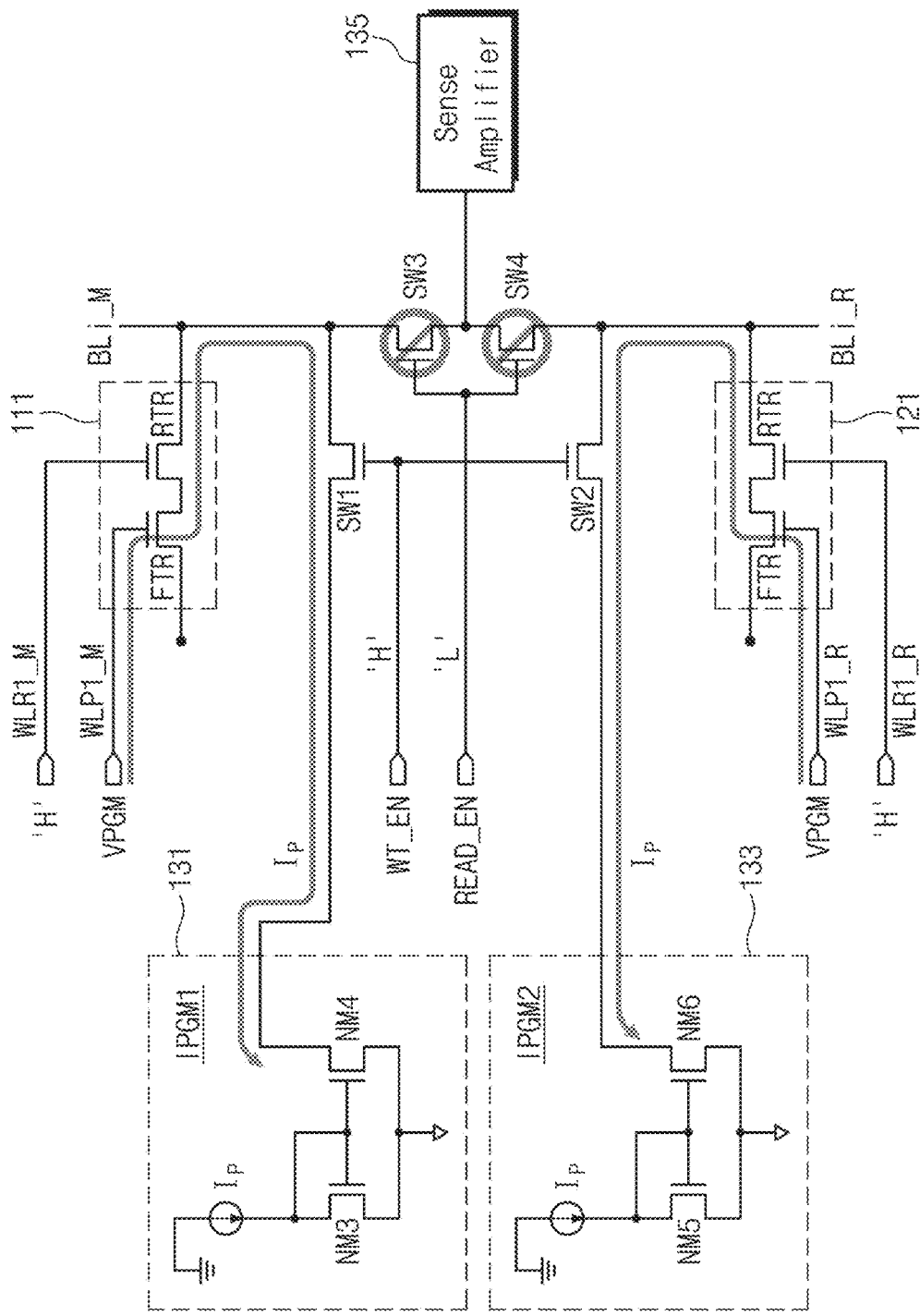
FIG. 7 is a circuit diagram illustrating an operation of a memory cell and the input/output circuit according to an example embodiment during a program operation.

FIG. 7 is a circuit diagram illustrating an operation of a memory cell and an input/output circuit according to an example embodiment during a program operation. Referring to FIG. 7, the write enable signal WT_EN of logic "H" and the read enable signal READ_EN of logic "L" are provided to the input/output circuit 130 during a program operation.

The third and fourth switches SW3 and SW4 are turned off by the read enable signal READ_EN of logic "L" so that the bit line BLi_M of the main cell 111 and the bit line BLi_R of the redundant cell 121 are electrically separated from each other, and the bit line BLi_M and the bit line BLi_R are separated from the sense amplifier 135.

The first and second switches SW1 and SW2 are turned on by the write enable signal WT_EN of logic "H" so that the first current source circuit 131 is connected to the bit line BLi_M, and the second current source circuit 133 is connected to the bit line BLi_R.

A selection voltage for turning on the selection transistor RTR is transferred to the read word lines WLR1_M and WLR1_R in an on/off state of the first, second, third, and fourth switches SW1, SW2, SW3, and SW4 of the input/output circuit 130. In this case, the selection transistor RTR of each of the main cell 111 and the redundant cell 121 is turned on. The program voltage VPGM is provided to the program word lines WLP1_M and WLP1_R.

The program voltage VPGM that is a high voltage is applied to the gate of the fuse transistor FTR of the main cell 111. Also, since the selection transistor RTR is in a turn-on state, the source of the fuse transistor FTR is electrically connected with the first current source circuit 131. That is, an oxide breakdown condition of the fuse transistor FTR is satisfied. Accordingly, the oxide layer of the fuse transistor FTR is broken down by a high voltage between the gate and the source of the fuse transistor FTR. That is, the fuse transistor FTR is programmed under the above-described condition.

The redundant cell 121 is programmed by the same principle as the main cell 111. However, the redundant cell 121 is electrically separated from the main cell 111, and the current source circuits 131 and 133 for supplying the program currents Ip are separated. Accordingly, stable supply of the program currents Ip is secured even though points in time when oxide layers of the main cell 111 and the redundant cell 121 are broken down are subtly different from each other under the same program bias condition.

According to the above-described program operation, it is possible to secure the program voltage VPGM and the program current Ip stably even though points in time when oxide layers of the main cell 111 and the redundant cell 121 are broken down are slightly different from each other. As a result, a program fail may be prevented from occurring due to a difference between points in time when the oxides of the main cell 111 and the redundant cell 121 are broken down.

Figure 8:
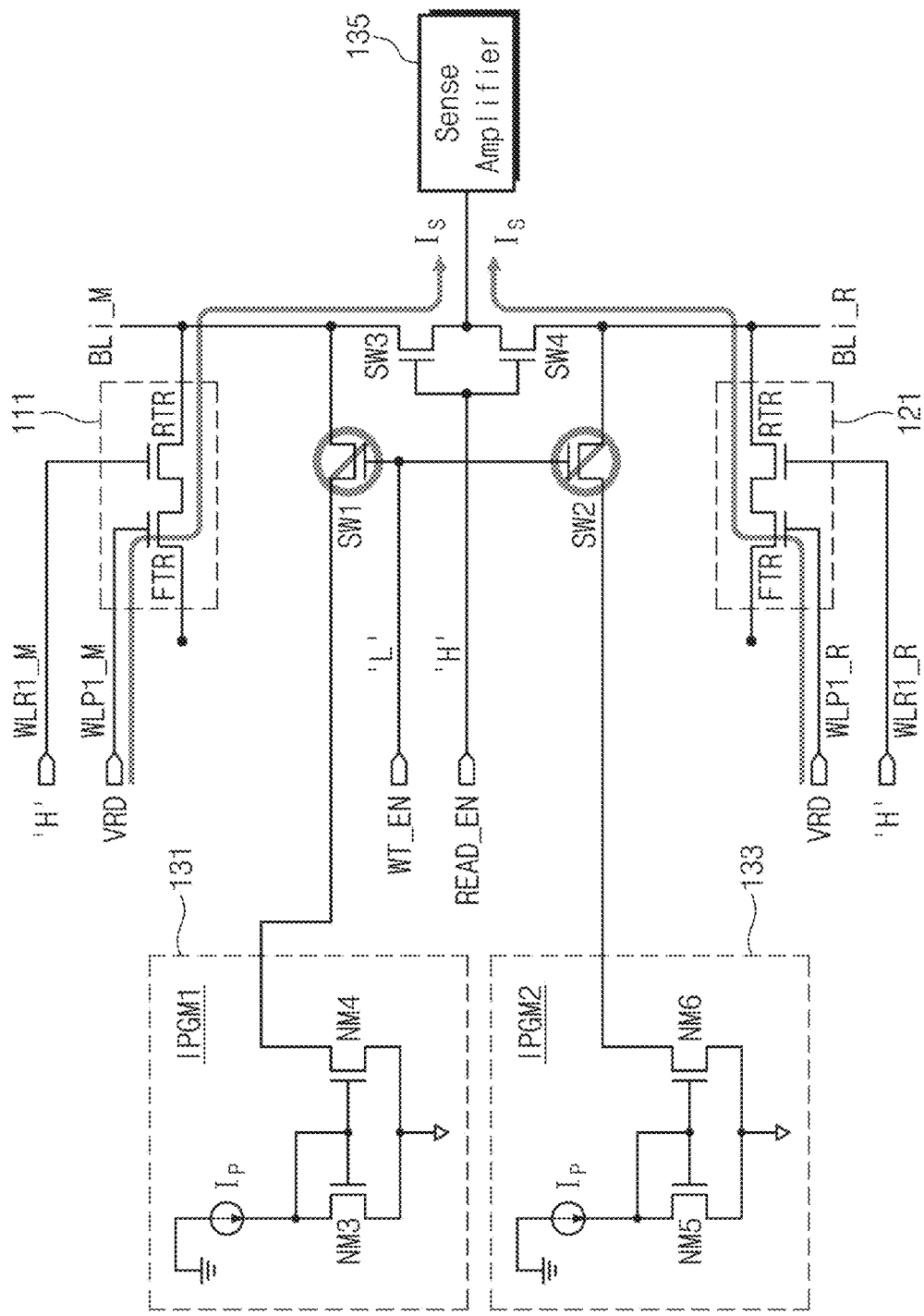
FIG. 8 is a circuit diagram illustrating an operation of the memory cell and the input/output circuit according to an example embodiment during a read operation.

FIG. 8 is a circuit diagram illustrating an operation of a memory cell and an input/output circuit according to an example embodiment during a read operation. Referring to FIG. 8, the write enable signal WT_EN of logic "L" and the read enable signal READ_EN of logic "H" are provided to the input/output circuit 130 during a read operation.

The third and fourth switches SW3 and SW4 are turned on by the read enable signal READ_EN of logic "L" so that the bit line BLi_M of the main cell 111 and the bit line BLi_R of the redundant cell 121 are electrically connected to each other, and the bit line BLi_M and the bit line BLi_R are connected with the sense amplifier 135.

The first and second switches SW1 and SW2 are turned off by the write enable signal WT_EN of logic "L" so that the first current source circuit 131 is disconnected from the bit line BLi_M, and the second current source circuit 133 is disconnected from the bit line BLi_R.

A selection voltage for turning on the selection transistor RTR is transferred to the selection word lines WLR1_M and WLR1_R in an on/off state of the first, second, third, and fourth switches SW1, SW2, SW3, and SW4 of the input/output circuit 130. In this case, the selection transistor RTR of each of the main cell 111 and the redundant cell 121 is turned on. The read voltage VRD is provided to the program word lines WLP1_M and WLP1_R.

In the case of a program state in which oxide layers of the fuse transistors FTR of the main cell 111 and the redundant cell 121 are broken down, the gate and the source of the fuse transistor FTR are electrically connected. Accordingly, the gates, to which the read voltage VRD is provided, of the fuse transistors FTR of the main cell 111 and the redundant cell 121 are connected to the bit lines BLi_M and BLi_R. Sensing currents Is that respectively flow to the bit lines BLi_M and BLi_R are added and provided to the sense amplifier 135. The sense amplifier 135 may determine data stored in an OTP memory cell by sensing a level of the sensing current Is or a voltage of a bit line corresponding to a sensing current.

In the case where the oxide layers of the fuse transistors FTR of the main cell 111 and the redundant cell 121 are not broken down, the sensing currents Is do not flow to the bit lines BLi_M and BLi_R even though the read voltage VRD is applied. The sense amplifier 135 may determine a logical value stored in the OTP memory cell by sensing the above-described state.

Figure 9:
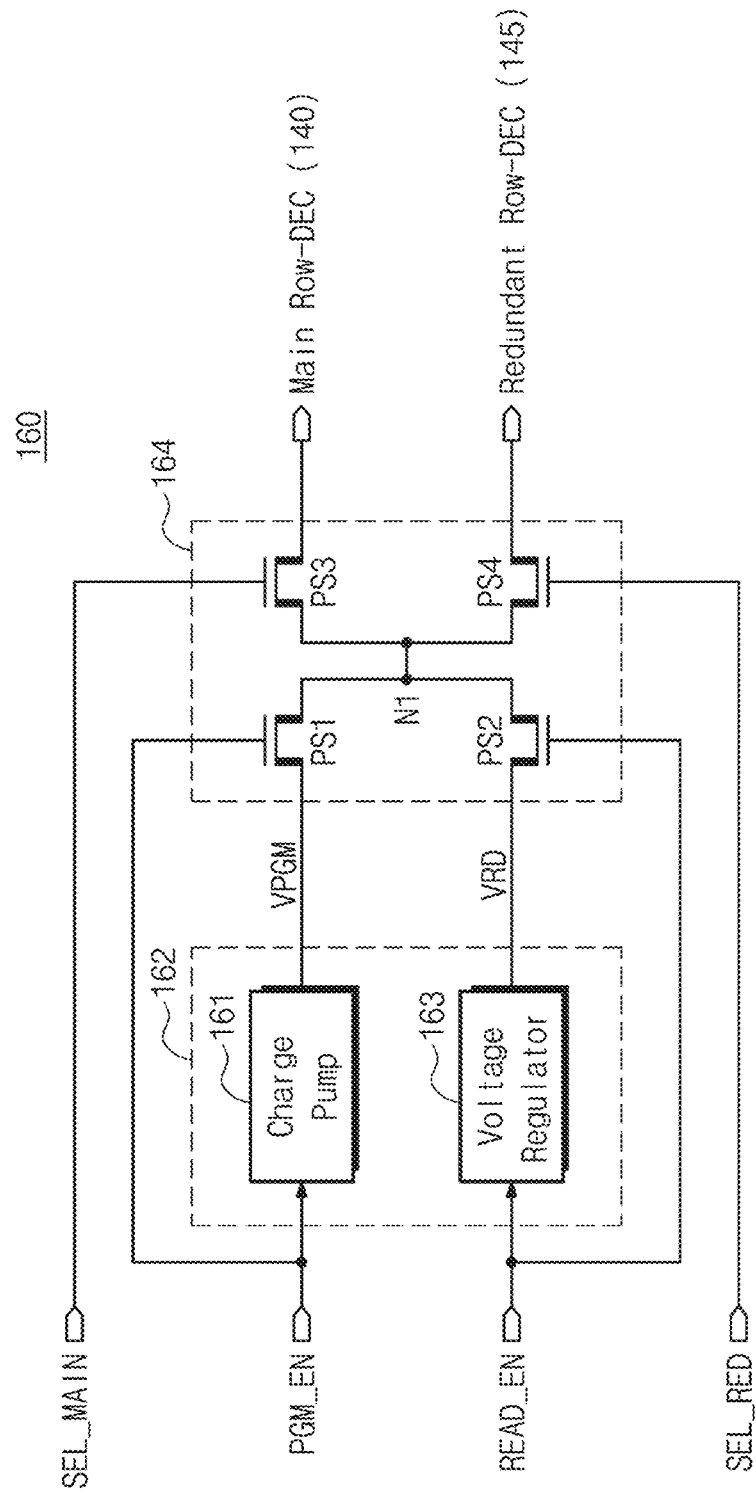
FIG. 9 is a block diagram illustrating a voltage generator of FIG. 1.

FIG. 9 is a block diagram illustrating a voltage generator of FIG. 1. Referring to FIG. 9, the voltage generator 160 includes a voltage generation unit 162 and a switch circuit 164.

The voltage generation unit 162 generates a voltage to be provided to the gate of the fuse transistor FTR of an OTP memory cell in a program mode or a read mode. That is, the voltage generation unit 162 generates the program voltage VPGM in response to the program enable signal PGM_EN, and generates the read voltage VRD in response to a read enable signal READ_EN. A charge pump 161 may be used to generate the program voltage VPGM, and a voltage regulator 163 may be used to generate the read voltage VRD.

The charge pump 161 may generate a voltage of a high level necessary for the oxide breakdown of the fuse transistor FTR during a program operation. The charge pump 161 generates the program voltage VPGM by performing voltage pumping in response to the program enable signal PGM_EN.

The voltage regulator 163 converts a level of a power supply voltage Vdd provided to the OTP memory device 100 to output the read voltage VRD. The read voltage VRD may be provided to the gate of the fuse transistor FTR during a read operation. The voltage regulator 163 may output the read voltage VRD in response to the read enable signal READ_EN. Since the read voltage VRD requires a level lower than that of the program voltage VPGM, there is no need for a charge pump having a high boosting capacity.

The switch circuit 164 includes a plurality of voltage switches, i.e., a first voltage switch PS1, a second voltage switch PS2, a third voltage switch PS3, and a fourth voltage switch PS4. The first and second voltage switches PS1 and PS2 select a voltage kind. The third and fourth voltage switches PS3 and PS4 are used to select whether transfer a selected voltage to the main cell array 110 (FIG. 1) or to the redundant cell array 120.

If the program enable signal PGM_EN is activated and the read enable signal READ_EN is deactivated, the charge pump 161 generates the program voltage VPGM. The first voltage switch PS1 is turned on, and the second voltage switch PS2 is turned off. In this case, the program voltage VPGM is transferred to a first node N1 through the first voltage switch PS1. In a program operation according to an example embodiment, the main cell MC and the redundant cell RC are programmed at the same time through one-time programming. For this reason, selection signals SEL_MAIN and SEL_RED are simultaneously activated to program the main cell MC and the redundant cell RC at the same time. In this case, the program voltage VPGM supplied to the first node N1 may be transferred to the main row decoder 140 and the redundant row decoder 145 through the voltage switches PS3 and PS4, respectively.

Alternatively, in the case of sequentially programming the main cell MC and the redundant cell RC, the third and fourth voltage switches PS3 and PS4 may be sequentially turned on by sequentially activating the selection signals SEL_MAIN and SEL_RED. In this case, the selection signals SEL_MAIN and SEL_RED may be generated by using a sequential logic circuit implemented in the control logic 150.

In contrast, if the program enable signal PGM_EN is deactivated and the read enable signal READ_EN is activated, the first voltage switch PS1 is turned off, and the second voltage switch PS2 is turned on. As such, the read voltage VRD is transferred to the first node N1. The read voltage VRD is transferred to the main row decoder 140 and the redundant row decoder 145 through the third and fourth voltage switches PS3 and PS4 turned on by the selection signals SEL_MAIN and SEL_RED.

The program voltage VPGM is separately provided to the main cell 111 and the redundant cell 121 by the voltage generation unit 162 and the switch circuit 164 above described. That is, the program voltage VPGM is separately provided to the main row decoder 140 and the redundant row decoder 145 by the voltage switches PS3 and PS4. According to the above-described way to provide the program voltage VPGM, an issue such as a decrease in a word line voltage due to a program speed difference between the main cell MC and the redundant cell RC may be solved. That is, the program voltage VPGM is separately provided from the voltage generator 160 such that a drop of a word line voltage generated at a first programmed cell fails to have an influence on programming of another memory cell. In addition, a leakage current may be prevented from being generated at unselected word lines during a program operation by the above-described way to supply the program voltage.

Figure 10:
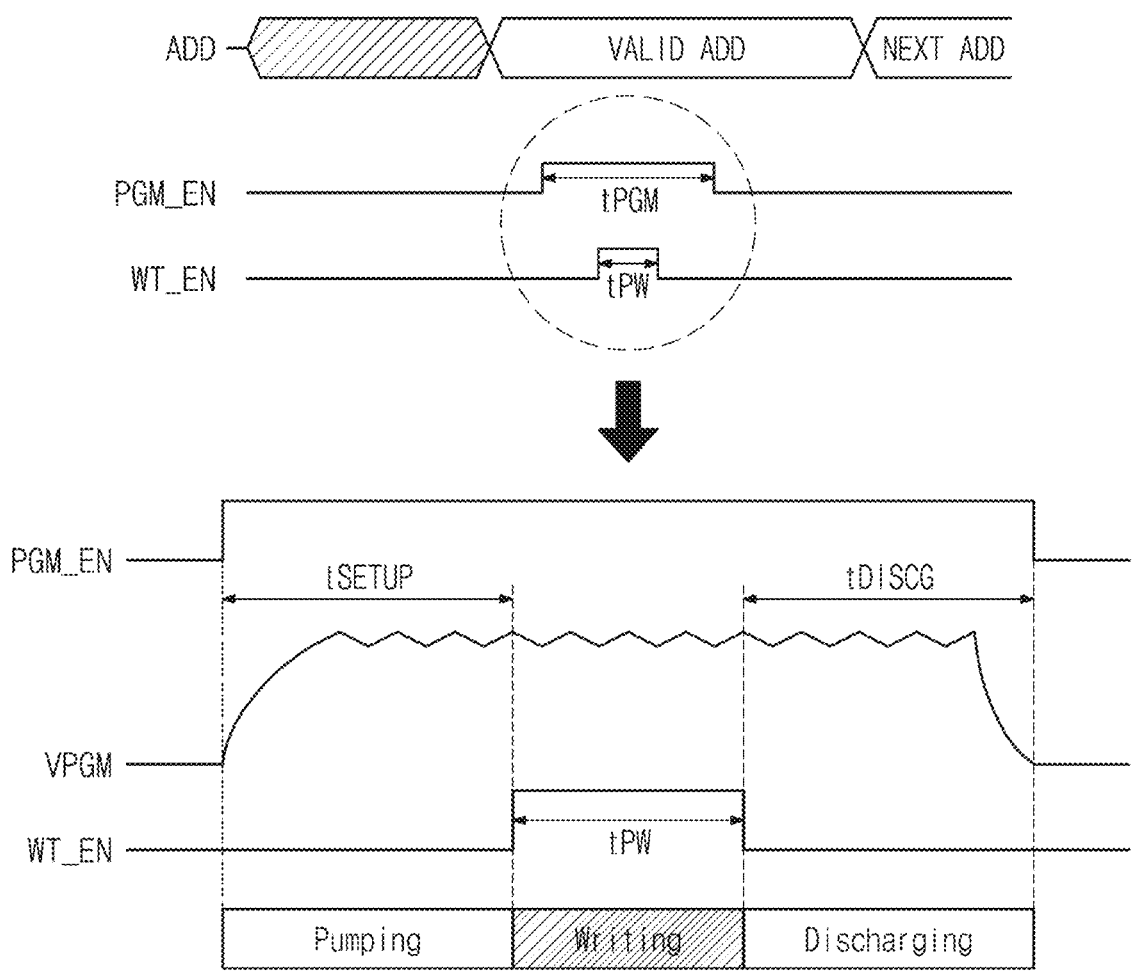
FIG. 10 is a timing diagram illustrating a program voltage applying method of the OTP memory device according to an example embodiment.

FIG. 10 is a timing diagram illustrating a program voltage applying method of an OTP memory device according to an example embodiment. Referring to FIG. 10, the address ADD, the program enable signal PGM_EN and the write enable signal WT_EN are provided to the control logic 150 in a program mode of operation. However, the main cell MC and the redundant cell RC selected by the address ADD may be programmed at the same time. Accordingly, a pulse of the program enable signal PGM_EN and a pulse of the write enable signal WT_EN are provided only once.

During a program operation, a valid address ADD, the program enable signal PGM_EN and the write enable signal WT_EN may be provided to the OTP memory device 100. A slashed address provided to an address input terminal means an invalid address. If the valid address VALID ADD is input from substantially the outside, the main and redundant cells MC and RC to be programmed are selected by the row decoder 140 and 145. In this case, the selection transistors RTR of the selected main and redundant cells MC and RC may be turned on.

The program enable signal PGM_EN is provided if the main cell MC and the redundant cell RC are completely selected by the valid address VALID ADD. A pulse width tPGM of the program enable signal PGM_EN includes a setup time tSETUP, a write time tPW, and a discharge time tDISCG. The setup time tSETUP means a time taken for the program voltage VPGM to increase to a stable level by the charge pump 161. The write time tPW represents a time when the write enable signal WT_EN is activated and an oxide layer of the fuse transistor FTR is substantially broken down by the program voltage VPGM and the program current Ip. The discharge time tDISCG represents a time when the program voltage VPGM applied to the row decoder 140 and 145 or a word line is discharged.

There is a need for the program enable signal PGM_EN or the write enable signal WT_EN only once upon programming an OTP memory cell according to an example embodiment. Accordingly, it may be possible to markedly reduce a program time of the OTP memory device 100.

Figure 11:
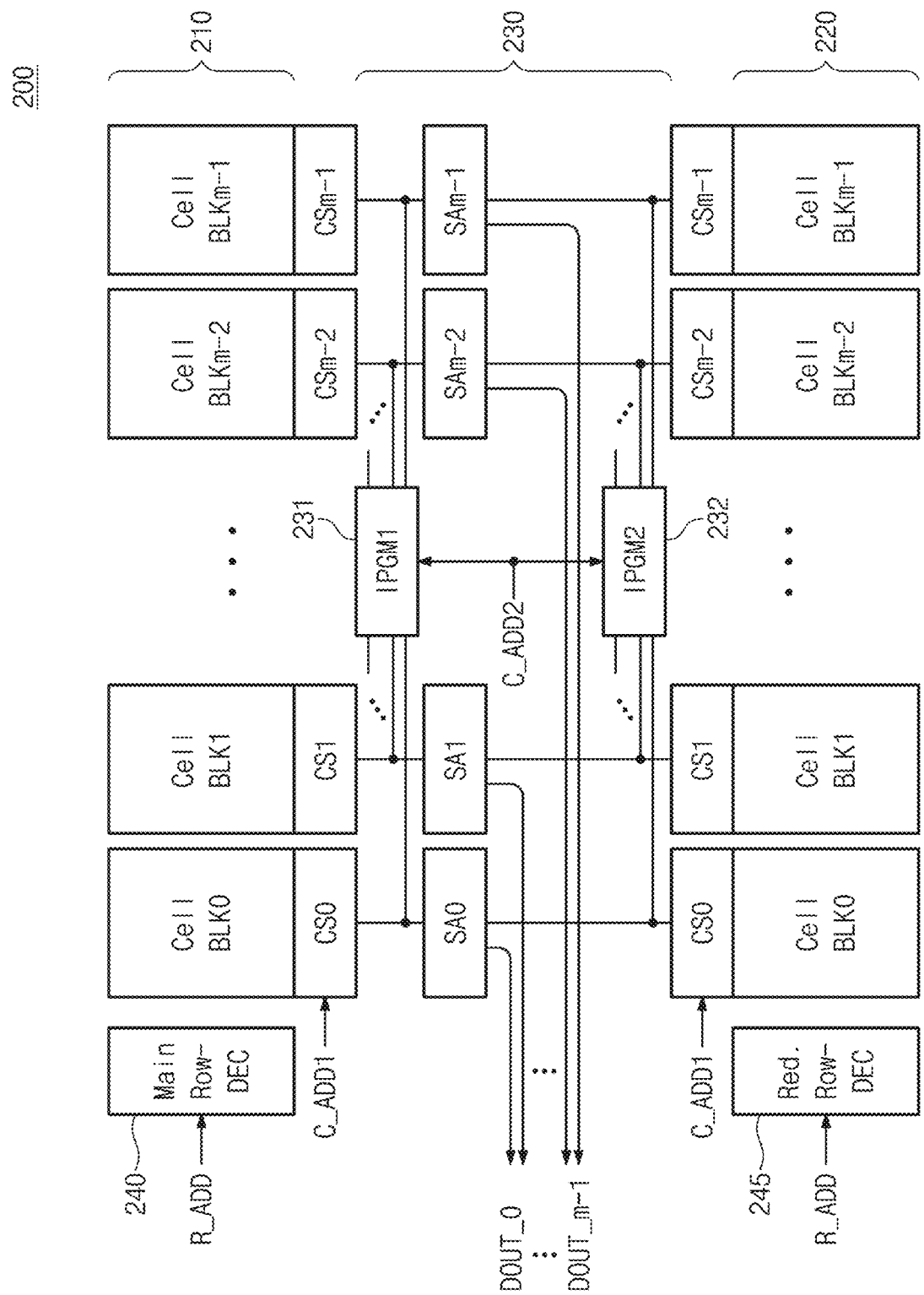
FIG. 11 is a block diagram illustrating the OTP memory device according to another example embodiment.

FIG. 11 is a block diagram illustrating an OTP memory device according to another example embodiment. Referring to FIG. 11, an OTP memory device 200 includes a main cell array 210, a redundant cell array 220, an input/output circuit 230, a main row decoder 240, a redundant row decoder 245, and column selector circuits CS0 to CSm−1.

Each of the main cell array 210 and the redundant cell array 220 may include a plurality of cell blocks Cell BLK0 to Cell BLKm−1. Each of the cell blocks Cell BLK0 to Cell BLKm−1 of the main cell array 210 is connected to the main row decoder 240, and each of the cell blocks Cell BLK0 to Cell BLKm−1 of the redundant cell array 220 is connected to the redundant row decoder 245. A word line of the cell blocks Cell BLK0 to Cell BLKm−1 of the main cell array 210 may be selected by a row address R_ADD provided to the main row decoder 240, and a word line of the cell blocks Cell BLK0 to Cell BLKm−1 of the redundant cell array 220 may be selected by the row address R_ADD provided to the redundant row decoder 245. Each of the cell blocks Cell BLK0 to Cell BLKm−1 may include OTP memory cells each including the fuse transistor FTR and the selection transistor RTR that are implemented as illustrated in FIGS. 2A and 2B.

In addition, each of the column selector circuits CS0 to CSm−1 may select a bit line of each of the cell blocks Cell BLK0 to Cell BLKm−1 in response to a first column address C_ADD1 received.

The input/output circuit 230 includes a plurality of sense amplifiers SA0 to SAm−1, a first current source circuit 231, and a second current source circuit 232. During a program operation, the first current source circuit 231 is supplied with a second column address C_ADD2 to supply the program current Ip to a bit line of a selected main cell. During the program operation, the second current source circuit 232 is supplied with the second column address C_ADD2 to supply the program current Ip to a bit line of a selected redundant cell. The first current source circuit 231 and the second current source circuit 232 may independently supply program currents to the main cell MC and the redundant cell RC during the program operation.

The sense amplifiers SA0 to SAm−1 may be activated in a read mode of operation. Each of the sense amplifiers SA0 to SAm−1 simultaneously senses the main cell MC and the redundant cell RC through a bit line of a selected memory cell during a read operation. A bit line of the main cell MC and a bit line of the redundant cell RC are connected to each other in the read mode of operation. Each of the sense amplifiers SA0 to SAm−1 senses data programmed in the main cell MC and the redundant cell RC through the connected bit lines. The sense amplifiers SA0 to SAm−1 output the sensing results as output data DOUT_0 to DOUT_m−1.

As described above, in the OTP memory device 200 according to an example embodiment, the main cell array 210 and the redundant cell array 220 are separately arranged with respect to the input/output circuit 230. The input/output circuit 230 electrically separates the bit line of the main cell MC and the bit line of the redundant cell RC from each other during the program operation. The input/output circuit 230 may independently supply program currents Ip to the separated bit lines of the main cell MC and the redundant cell RC.

According to example embodiments, a memory device including OTP memory cells may simultaneously program a main OTP memory cell and a redundant OTP memory cell stably, thereby markedly reducing manufacturing costs of a semiconductor device including an OTP memory.

While example embodiments have been described, it will be apparent to those skilled in the art that various changes and modifications may be made without departing from the spirit and scope of the inventive concept. Therefore, it should be understood that the above example embodiments are not limiting, but illustrative.

What is claimed is:

1. A memory device comprising:
   a main one-time programmable (OTP) memory cell connected to a main word line and a main bit line, wherein the main word line comprises a program word line and a selection word line;
   a redundant OTP memory cell connected to a redundant word line and a redundant bit line; and
   an input/output circuit configured to, during a program operation to program: i) the main OTP memory cell to program a first data bit value, and ii) the redundant OTP memory cell to program the first data bit value, apply a programming voltage to the program word line to break down an oxide layer of the main OTP memory cell and electrically separate the main bit line and the redundant bit line and form a first program current path to the main bit line and a second program current path to the redundant bit line, wherein the first program current path and the second program current path are independent from each other, wherein the input/output circuit is further configured to program the first data bit value to the main OTP memory cell and to the redundant OTP memory cell at substantially the same time.

2. The memory device of claim 1, wherein the input/output circuit comprises:
   a first current source circuit configured to provide a first program current via the first program current path to the main bit line; and
   a second current source circuit configured to provide a second program current via the second program current path to the redundant bit line.

3. The memory device of claim 2, wherein the input/output circuit further comprises:
   a first switch configured to connect the first current source circuit to the main bit line to form the first program current path in response to a write enable signal; and
   a second switch configured to connect the second current source circuit to the redundant bit line to form the second program current path in response to the write enable signal.

4. The memory device of claim 3, wherein the input/output circuit further comprises:
   a sense amplifier configured to sense data programmed in the main OTP memory cell and the redundant OTP memory cell;
   a third switch configured to connect the sense amplifier and the main bit line in response to a read enable signal; and
   a fourth switch configured to the sense amplifier and the redundant bit line in response to the read enable signal.

5. The memory device of claim 4, wherein the third switch and the fourth switch are turned off to electrically separate the main bit line and the redundant bit line during the program operation.

6. The memory device of claim 1, further comprising:
   a main row decoder configured to select the main word line in response to a row address; and
   a redundant row decoder configured to select the redundant word line in response to the row address.

7. The memory device of claim 1, further comprising a voltage generator configured to provide a program voltage and a read voltage to each of the main word line and the redundant word line.

8. The memory device of claim 7, wherein the voltage generator comprises:
- a charge pump configured to generate the program voltage;
- a voltage regulator configured to generate the read voltage; and
- a switch circuit configured to transfer the program voltage or the read voltage to the main word line or the redundant word line depending on an operation mode.

9. The memory device of claim 8, wherein the switch circuit comprises:
- a first voltage switch configured to transfer the program voltage that is generated by the charge pump to a first node depending on the operation mode;
- a second voltage switch configured to transfer the read voltage that is generated by the voltage regulator to the first node depending on the operation mode;
- a third voltage switch configured to electrically connect the first node to the main word line in response to a first selection signal; and
- a fourth voltage switch configured to electrically connect the first node to the redundant word line in response to a second selection signal.

10. A program method of a memory device which comprises a main one-time programmable (OTP) memory cell and a redundant OTP memory cell, the program method comprising:
- receiving an address for selecting the main OTP memory cell and the redundant OTP memory cell together;
- generating a program voltage to be supplied to a program word line of the main OTP memory cell to program a first data bit value by breaking down an oxide layer of the main OTP memory cell and a redundant word line of the redundant OTP memory cell to program the first data bit value, wherein a main word line includes the program word line and a selection word line;
- electrically separating a main bit line to which the main OTP memory cell is connected and a redundant bit line to which the redundant OTP memory cell is connected; and
- supplying the program voltage to the main word line of the main OTP memory cell and the redundant word line of the redundant OTP memory cell and forming a first program current path to the main bit line and a second program current path to the redundant bit line, wherein the first program current path and the second program current path are independent from each other, and wherein the supplying the program voltage to the main word line of the main OTP memory cell and the redundant word line of the redundant OTP memory cell occurs at substantially the same time.

11. The program method of claim 10, further comprising:
- providing a first program current generated by a first current source circuit to the main bit line via the first program current path; and
- providing a second program current generated by a second current source circuit to the redundant bit line via the second program current path.

12. The program method of claim 10, wherein the main bit line and the redundant bit line are electrically connected to each other during a read operation.

13. A memory device comprising:
- a main cell array comprising a plurality of main one-time programmable (OTP) memory cells, wherein the main cell array includes a first main OTP memory cell configured to be programmed by a breakdown of an oxide layer of the first main OTP memory cell, and the first main OTP memory cell is connected to a main word line and a main bit line, wherein the main word line comprises a program word line and a selection word line;
- a redundant cell array comprising a plurality of redundant OTP memory cells, wherein the redundant cell array includes a first redundant OTP memory cell, and the first redundant OTP memory cell is connected to a redundant word line and to a redundant bit line; and
- an input/output circuit comprising a first current source circuit and a second current source circuit, the input/output circuit being configured to program a same data bit value to the first main OTP memory cell and to the first redundant OTP memory cell at substantially the same time by electrically connecting the first current source circuit, via the main bit line, to the first main OTP memory cell and the second current source circuit, via the redundant bit line, to the first redundant OTP memory cell.

14. The memory device of claim 13, wherein the input/output circuit is further configured to, during a program operation to program the first main OTP memory cell and the first redundant OTP memory cell, electrically separate the main bit line to which the first main OTP memory cell is connected and the redundant bit line to which the first redundant OTP memory cell is connected, and
wherein during the program operation, the main bit line and the redundant bit line are specified by a same column address.

15. The memory device of claim 14, wherein the input/output circuit is further configured to, in response to the program operation ending, electrically connect the main bit line and the redundant bit line.

16. The memory device of claim 13, wherein the first current source circuit and the second current source circuit are configured to generate program currents independently from each other.

* * * * *